United States Patent
Camilleri et al.

(10) Patent No.: US 6,732,347 B1
(45) Date of Patent: May 4, 2004

(54) CLOCK TEMPLATE FOR CONFIGURING A PROGRAMMABLE GATE ARRAY

(75) Inventors: Nicolas J. Camilleri, Santa Cruz, CA (US); Edward S. McGettigan, San Jose, CA (US); Kenneth J. Stickney, Jr., Boulder, CO (US); Jeffrey V. Lindholm, Longmont, CO (US); Kevin L. Bixler, Littleton, CO (US); Raymond Kong, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 204 days.

(21) Appl. No.: 09/844,054

(22) Filed: Apr. 26, 2001

(51) Int. Cl.[7] ..................... G06F 17/50; H03K 17/693
(52) U.S. Cl. ................... 716/16; 716/18; 716/3
(58) Field of Search ..................... 716/16, 18, 3

(56) References Cited

U.S. PATENT DOCUMENTS 5,649,176 A * 7/1997 Selvidge et al. ............ 713/400
5,815,405 A * 9/1998 Baxter ........................ 716/3

OTHER PUBLICATIONS

Xilinx's Application Note: Virtex Series; XAPP151 (v1.5), "Virtex Series Configuration Architecture User Guide" Sep. 27, 2000; pp. 1–45; available from Xilinx, Inc. 2100 Logic Drive, San Jose, California 95124.
Xilinx's Application Note; XAPP153 (v1.0), "Status and Control Semaphore Registers Using Partial Reconfiguration"; Jun. 7, 1999; pp. 1–4; available from Xilinx, Inc. 2100 Logic Drive, San Jose, California 95124.

* cited by examiner

Primary Examiner—A. M. Thompson
(74) Attorney, Agent, or Firm—William E. Zitelli; Lois D. Cartier

(57) ABSTRACT

A clock template includes digital programming information for programming clock frames of a programmable gate array (PGA). The digital programming information represents a number of different clock configurations that correspond to various designs in the PGA. In one embodiment, the digital programming information includes a bit stream for partially reconfiguring the PGA. In another embodiment, the digital programming information is embedded in digital programming information of at least one of the designs. Methods of configuring a PGA with different designs having different clocking configurations by utilizing the clock template are also disclosed.

21 Claims, 4 Drawing Sheets

CLOCK TEMPLATE FOR CONFIGURING A PROGRAMMABLE GATE ARRAY

FIELD OF THE INVENTION

The present invention is directed to the configuration of programmable gate arrays, in general, and more particularly, to a clock template and method of configuring a programmable gate array with a plurality of circuit designs having different clock configurations using the clock template.

BACKGROUND OF THE INVENTION

In the past, field programmable gate array (FPGA) architectures accommodated only configuration of the entire array. Accordingly, with each change in a design and/or the addition of a design, a whole new bit stream had to be generated for configuring or programming the whole FPGA. Recently, however, new FPGA architectures were developed, like the Virtex® series manufactured by Xilinx®, for example, that accommodated a partial reconfiguration even down to an information frame level. For a more detailed understanding of configuration and partial configuration of FPGAs reference is made to two Xilinx® application notes—(1) "Virtex Series Configuration Architecture User Guide", XAPP151 (v1.5), Sep. 27, 2000, and (2) "Status and Control Semaphore Registers Using Partial Reconfiguration", by Nick Camilleri, XAPP153 (v1.0), Jun. 7, 1999 which are incorporated by reference herein in their entirety.

With the new architectures, bit streams may be generated piecemeal for configuring portions of an FPGA with a plurality of different designs. But, obstacles remain in connection with fully implementing partial reconfiguration for all cases. Currently, only simple designs may take advantage of partial reconfiguration, like, for example, a design that has the same clock configuration and look up table (LUT)/flip flop (FF) usage as the designs already configured within the FPGA or a design that does not use clocks. Accordingly, one obstacle to overcome is how to handle the partial reconfiguration of designs with different clock configurations.

In the Xilinx® series of Virtex FPGAs, the clock configuration which controls the clock settings and routing throughout a design is embedded within each design. More specifically, FIG. 1 illustrates the programming structure of the architecture of an FPGA, like the Virtex series, for example. In this architecture example, the FPGA includes a plurality of columns, with each column divided into a number of frames. Each frame is essentially 1bit wide by N bits long and extends the full length of a column. A "shadow register" within each column having the same capacity as a frame of the column accepts data loaded into the FPGA destined for one of the frames of the particular column and temporarily buffers the data until it may load it into the designated frame without interrupting substantially operation of the FPGA. In FIG. 1, each column area is distinct and separate from the other column areas. For example, input/output block (IOB) frames of a column are programmed to control input/output routing and configuration, but do not involve configuration logic block (CLB) frames or block random access memory (BRAM) frames. Likewise, BRAM frames are programmed with data and routing configuration that do not involve CLB and IOB frames.

The CLB frames contain programmed design information within that particular column of an M×N FPGA, where M and N are the number of rows and columns of CLBs within the FPGA, respectively. On the other hand, the general clocking or GCLK frames of the center column of the FPGA contain clocking configurations or tree data for all of the programmed designs of the FPGA. With the current architecture of FPGAs, it is a rather complex and difficult operation to program partially a portion of the GCLK column for a particular design of the CLB frames, i.e., all of the clocking information corresponding to all of the designs must be loaded into the GCLK frames for the FPGA to operate properly. Accordingly, for partial reconfiguration, there is a problem that arises when multiple designs are programmed into an FPGA with different clocking structures as will be explained in greater detail herebelow.

A simple example of an FPGA that is split into two halves which are isolated from each other is shown in FIG. 2. Referring to FIG. 2, the left side columns of the FPGA may be programmed with a design A which may have multiple representations and variants referred to as A1, A2, ..., A(N). Similarly, the right side columns of the FPGA may be programmed with a design B which may also have multiple representations and variants referred to as B1, B2, ..., B(N). Only one design for A may be loaded into the FPGA at any one time. For example, if a new design variant A2 is loaded into the FPGA, it over-writes the previous design variant A1 that was stored in the columns of the left hand side thereof. The same procedure may be performed for the variants of design B in the right hand columns. The FPGA needs to be configured in such a way to permit both designs A and B to operate independent of one another. Note that in this simple example, the center column clocking frames are configured with both of the clocking configurations of the designs A and B. In practice, partially reconfiguring the FPGA in this manner is not easily achievable due primarily to the architecture limitations accommodating programming of the center clocking column as mentioned above.

For example, to initially configure an FPGA, a full bit stream is generated for programming the columns of the left hand side and center clocking column with a version of design A and defining the columns of the right hand side as blank or unused as shown in the illustration of FIG. 3. Notice that the center GCLK clock frames are programmed or configured solely to meet the requirements of the programmed version of design A. Thereafter, the FPGA may be partially reconfigured with a version of design B by programming the right hand columns thereof and the center clocking column which over writes the clocking configuration for the version of design A as shown by the illustration of FIG. 4. In this configuration, the FPGA can function properly as design B, but can no longer operate as design A because design A's clock configuration was overwritten by the partial reconfiguration of the FPGA with design B. It may be possible to create a bit stream to program design B into the FPGA without programming the center clock column with B's clocking configuration, but then the FPGA will function properly as design A, but not as design B. Accordingly, the same problem exists.

The present invention overcomes the drawbacks described herein above regarding the current architecture of FPGAs and permits partial reconfiguration of an FPGA with multiple designs having different clocking configurations.

SUMMARY OF THE INVENTION

In accordance with one aspect of the present invention, a clock template comprises digital programming information representative of a plurality of different clock configurations corresponding to a plurality of designs for programming clock frames of a programmable gate array (PGA) to configure the PGA in accordance with said corresponding plurality of designs. In one embodiment, the digital information comprises a bit stream for partially reconfiguring the PGA. In another embodiment, the digital information is embedded in digital programming information of at least one of the plurality of designs.

In accordance with another aspect of the present invention, a method of configuring a PGA with a plurality of different designs having different clocking configurations comprises the steps of: creating a high level descriptive design language representation of each of the plurality of designs, each said design representation including a clocking configuration portion; copying said clocking configuration portions from said design representations into a high level descriptive design language clock template; and using said clock template to configure the PGA.

In accordance with yet another aspect of the present invention, a method of configuring a PGA with a plurality of different designs having different clocking configurations comprises the steps of: creating a high level descriptive design language representation of each of the plurality of designs, each said design representation including a clocking configuration portion; compiling the design representations as independent high level descriptive design language files to produce bit stream representations thereof; extracting from said bit stream design representations bit stream portions representative of the clocking configurations of each design; and programming clocking frames of the PGA with said extracted bit stream portions.

DETAILED DESCRIPTION OF THE DRAWINGS

In configuring or partially reconfiguring a programmable gate array (PGA), like a field programmable gate array, for example, with one or more designs, the design usually starts with a high level textually descriptive design language, like Verilog HDL (herein after referred to as "Verilog") or VHDL, for example. After the Verilog design has been generated, it is read by a software system which is peculiar to the PGA being programmed or configured generally running on a personal computer (PC) or a work station. The software operates automatically to first partition the design in Verilog into logic blocks, then to find a near optimum placement for each logic block within the PGA, and finally to select an interconnect routing among the logic blocks. The user may affect the outcome by selectively editing critical portions of the design during the software processing thereof as will become more apparent from the description herein below. Once the design process is complete, a detailed timing report is generated and a bit stream is produced by the software system for each design which may be downloaded into the PGA, into a PROM for field configuration, or made available as a computer file for field configuration via a microprocessor, for example.

The present invention will now be described by way of a simple example in which a design A comprises an UP counter digital design and design B comprises a DOWN counter digital design. The UP and DOWN counter designs of the present embodiment are represented in Verilog programs found in Appendix I and designated as "prupcnt.v" and "prdncnt.v", respectively. Reference may be made to the programs of Appendix I from time to time during this description to illustrate exemplary modifications to the Verilog designs to create a clock template suitable for embodying the present invention. Accordingly, designs A and B are to be configured in the left and right hand columns, respectively, of the PGA and operate mutually exclusive of one another as described herein above.

Figure 5:
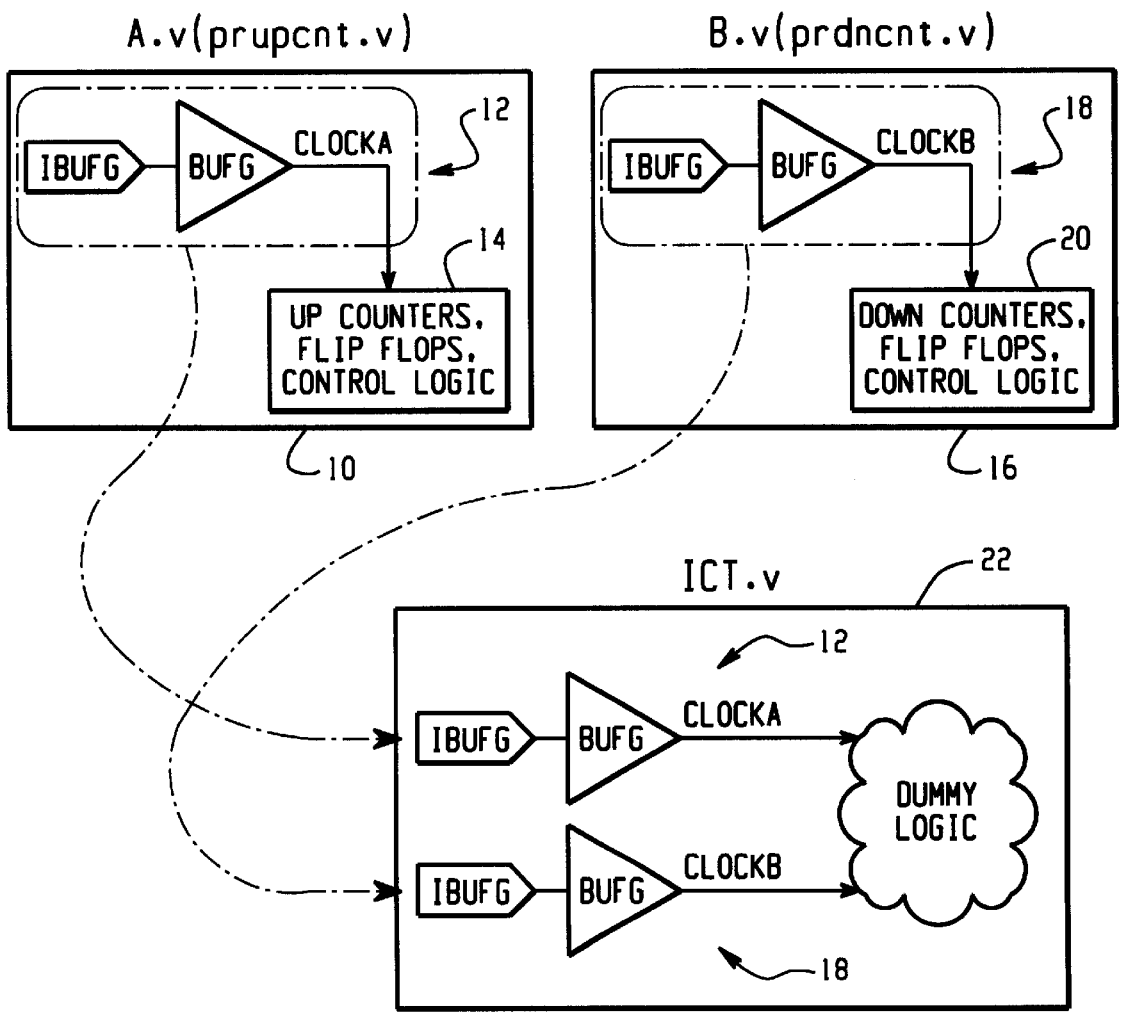
FIG. 5 is a block diagram illustration of one aspect of the present invention.

FIG. 5 is a block diagram representation of one embodiment of the present invention including the A and B designs as described above and an independent clock template that is a separate design in a high level descriptive design language such as Verilog, for example. Referring to FIG. 5, the up counter design A is represented by block 10 which includes a clock configuration portion 12 shown encircled and a configurable logic block portion 14. Also, in FIG. 5, the down counter B design is represented by a block 16 which includes a clock configuration portion 18 shown encircled and a configurable logic block portion 20. The IBUFG and BUFG blocks of each clock configuration 12 and 18 represent physical elements of the PGA architecture for the fast clock input pin and global clock buffer, respectively, for example.

In the embodiment depicted in FIG. 5, the statements embodying the clock configuration 12 are copied from the Verilog file "prupcnt.v" denoted as A.v into an independent clock template Verilog file denoted as ICT.v and illustrated by block 22 in FIG. 5. These copied statements remain in the "prupcnt.v" file as shown in Appendix I as IBUFG and BUFG which together with other instructions define the routing of a clock signal from an input pin of the PGA through a clock buffer to create a clock input signal CLOCKA for the up counter design A. Likewise, the statements embodying the clock configuration 18 are copied from the Verilog file "prdncnt.v" denoted as B.v into the independent clock template Verilog file ICT.v (block 22). These copied statements remain in the "prdncnt.v" file as shown in Appendix I as IBUFG and BUFG which together with other instructions define the routing of a clock signal from an input pin of the PGA through a clock buffer to create a clock input signal CLOCKB for the down counter design B. Accordingly, a new Verilog design file 22 is created with the clocking configurations of the various designs and their respective areas of the PGA. Dummy logic and/or special constraints in a high level design language, for example, may be added to the clock template file 22 so that the clock signals are terminated in some fashion in order to prevent the clocking configurations of the ICT.v file from being optimized out during a compilation thereof.

The new clock template file 22 is a separate design which meets the needs of the clocking requirements of the A and B designs. It may be compiled independently in the system software as will be more fully described below to create a bit stream to program just the frames of the clocking column. Accordingly, with each new design or change in design of the PGA, the clocking configuration thereof is copied into the independent clock template file which may be compiled separately from the other designs to create a separate bit stream to partially reconfigure the clocking column independently of the partial reconfiguration of the PGA for the individual designs. An example of a Verilog file for the independent clock template is found in Appendix II.

Figure 6:
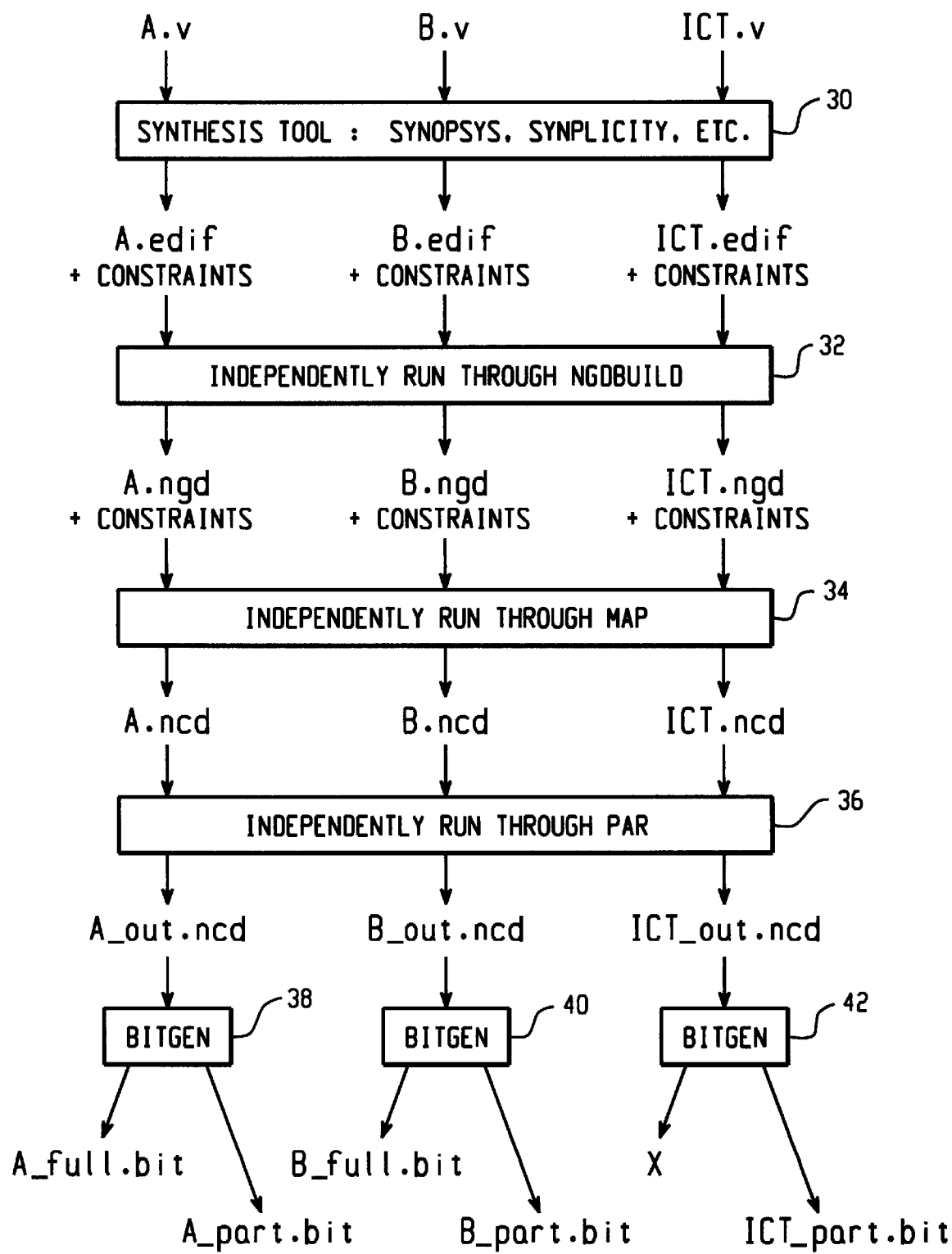
FIG. 6 is a block diagram illustrating the steps of an exemplary compilation process suitable for use with the present embodiment.

FIG. 6 is a flow chart illustrating the software processing of the programs of the partial reconfiguration designs A.v and B.v and including the clock template ICT.v. While the diagram of FIG. 6 illustrates the processing of the three programs together, it is understood that this is done merely for the purposes of convenience and that the programs are actually processed independently, one at a time. Referring to FIG. 6, the program A.v may be first synthesized in step 30 by a conventional Synthesis Tool which may include Synopsys, or Synplicity, . . . , etc. type programs to create a new file "A.edif" plus certain constraint files that limit the design to their allowed column areas within the PGA. The new file "A.edif" plus constraint files are run through an NGDBUILD program in step 32 to create a file "A.ngd" plus additional pin locking constraint files which are then mapped in step 34 through a MAP program to create an "A.ncd" file. The A.ncd file is placed and routed (PAR) in step 36 through a conventional PAR program which will prevent routing of design A across the center boundary of the PGA and limit the programming to the columns of the left hand side. The PAR processing yields the file "A_out.ncd" which is first passed through a Bitgen program 38 with options set to create a full configuration bit stream file denoted as "A_full.bit" which may be used to program the PGA. The A_out.ncd file may be passed through the Bitgen program 38 a second time with other options thereof set to create a bit stream file denoted as "A_part.bit" for a partial reconfiguration of the PGA for design A. In the present embodiment, the A_part.bit file will not include the clock configuration column programming information of the A design.

The programs B.v and ICT.v may be compiled separately through the same processing steps as described for A.v above and shown in the illustration of FIG. 6. Processing of the B.v program yields the bit stream files "B_full.bit" and/or "B_part.bit" via Bitgen program 40. However, the processing of the ICT.v program yields only a partial reconfiguration bit stream file denoted as "ICT_part.bit" via Bitgen program 42. No full configuration bit stream file is needed for the clock template in the present embodiment. Also, in the present embodiment, the B_part.bit file will not include the clock configuration programming information of design B.

Figure 1:
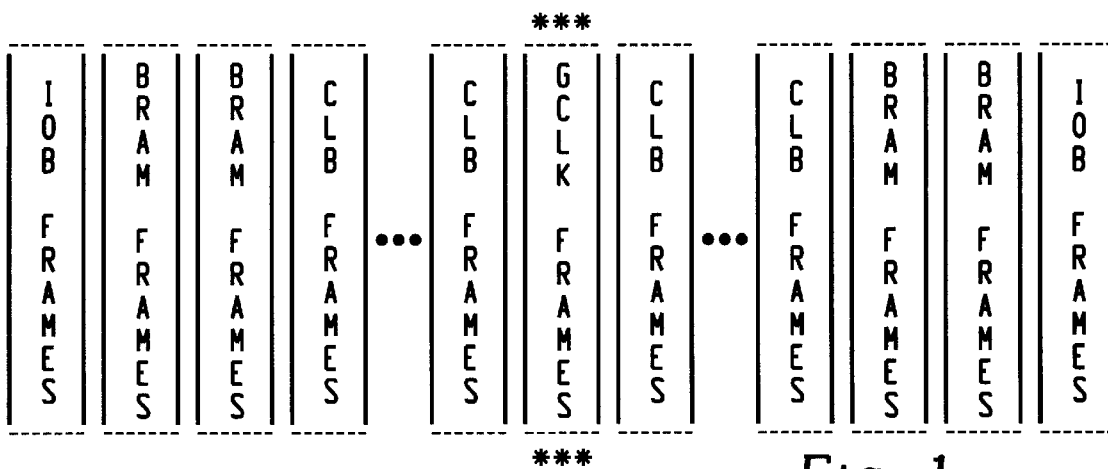
FIG. 1 is an illustration of the architecture of an exemplary programmable gate array (PGA) suitable for being configured with the present invention.
Figure 2:
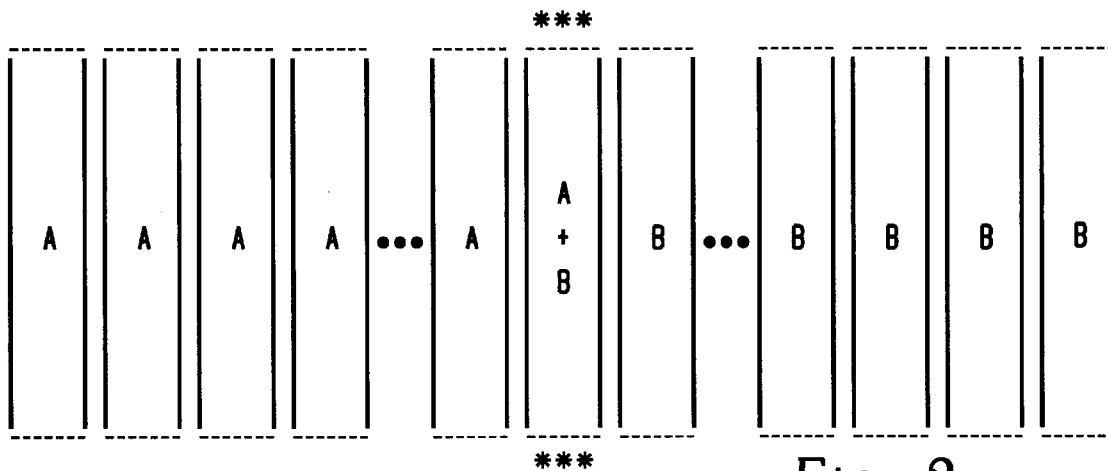
FIG. 2 is an illustration of the PGA configured with a plurality of designs.
Figure 3:
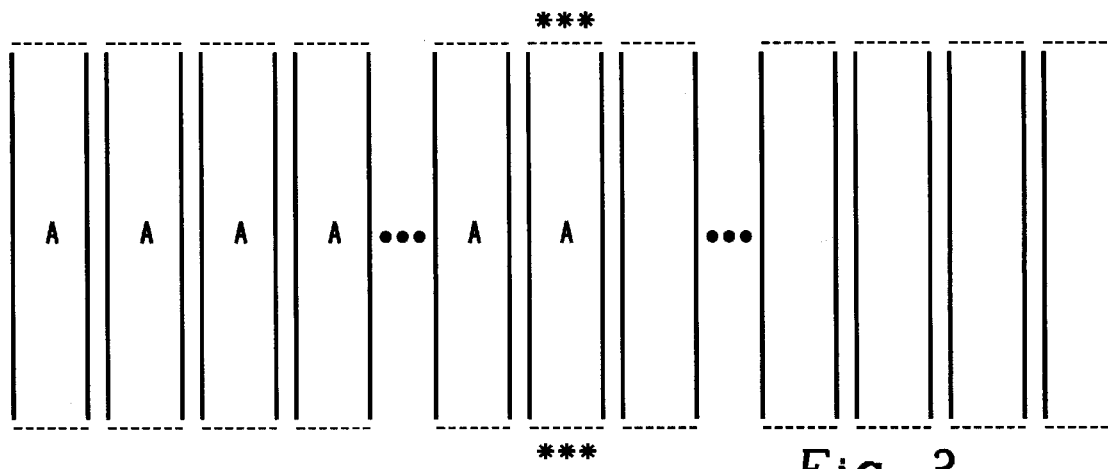
FIG. 3 is an illustration of the PGA configured with only a first design.
Figure 4:
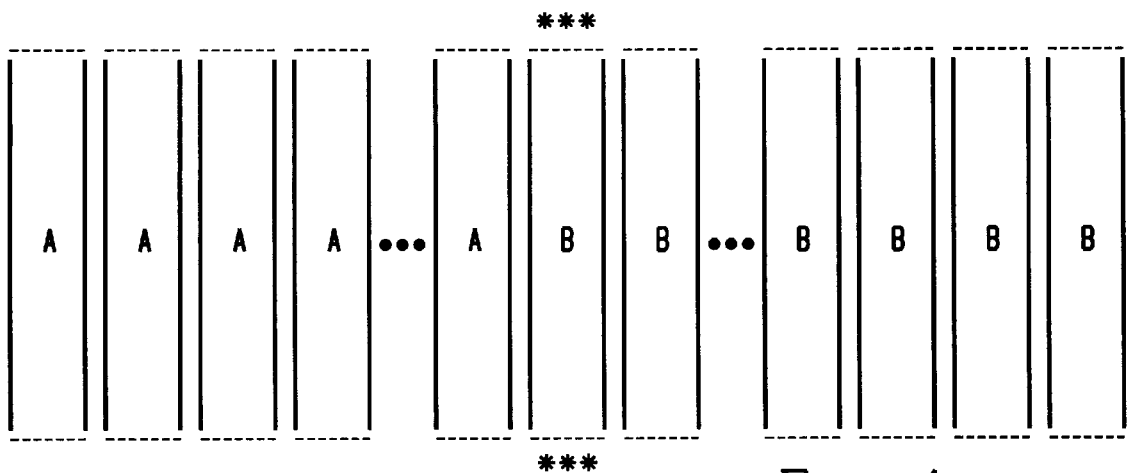
FIG. 4 is an illustration of the PGA configured sequentially with the first design and then a second design which overwrites clocking frames configured by the first design.
Figure 7:
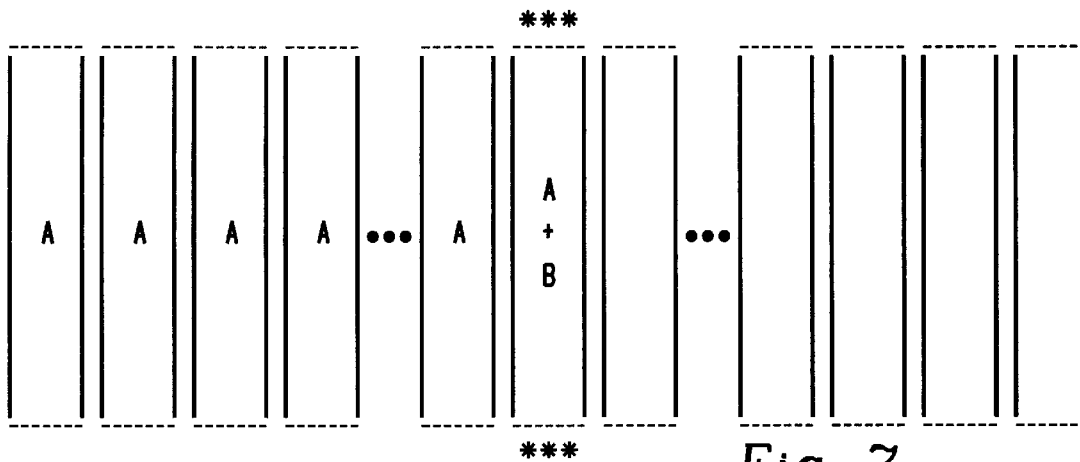
FIG. 7 is an illustration of the PGA configured according to one or more aspects of the present invention.

The PGA may then be programmed with the bit stream files generated from the foregoing described compilations in connection with the illustration of FIG. 6. For example, the PGA may be first configured with the bit stream file "A_full.bit" which renders the left hand columns and the clock configuration column programmed with design A and the right hand columns programmed as blank or unused such as shown by the illustration of FIG. 3. Thereafter., the PGA may be partially reconfigured with the clock template bit stream file "ICT_part.bit" rendering the clock configuration or center column thereof programmed with the clocking configurations of all of the designs as shown by the illustration of FIG. 7. Then, the PGA is partially reconfigured with the partial bit stream files of the other designs of the PGA. In the present example, the only other design is design B. Therefore, the PGA is configured with the partial bit stream file "B_part.bit" rendering the right hand columns programmed with design B yielding a fully configured PGA as shown by the illustration of FIG. 2. The sequence of programming the PGA with the bit stream file designs may be altered for convenience to fit the particular application. For example, the PGA may be first programmed with the file "B_full.bit" first, then partially reconfigured with the partial bit stream file "ICT art.bit", and then partially reconfigured with the partial bit stream files of the other designs in any order without deviating from the broad principles of the present invention.

In another embodiment of the present invention, which is a preferred embodiment, it is possible to copy and embed the clocking configurations of all of the designs of the PGA into at least one verilog design file. For the simple case of the A and B designs as described herein above, the clocking configuration 18 for the high level design language file 16 for design B may be copied therefrom and embedded into the high level design language file 10 for design A as shown by the block diagram illustration of FIG. 8. Note that the clock configuration of design B remains in the file 16. Dummy logic and/or special constraints may added to the embedded clock configuration 18 of file 10 so that the clock signal CLOCKB is terminated in some fashion in order to prevent the clock configuration 18 from being optimized out during a compilation of the new file.

Figure 8:
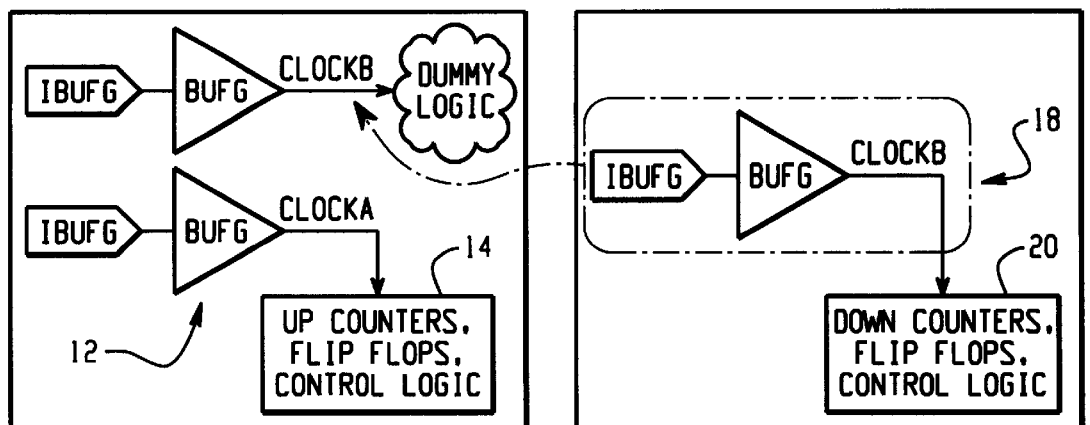
FIG. 8 is a block diagram illustration of another aspect of the present invention.
Figure 9:
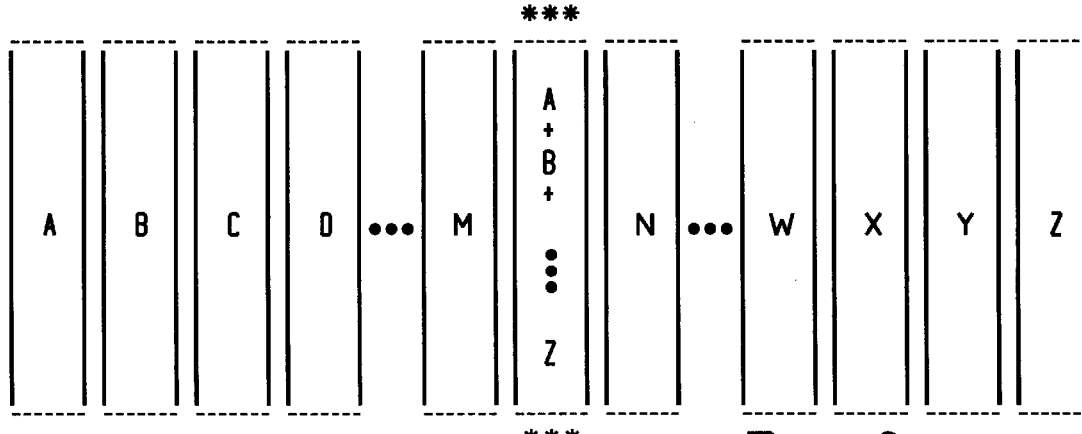
FIG. 9 is an illustration of the PGA configured for a multiplicity of designs in accordance with one or more aspects of the present invention.

In this fashion, Verilog files are created—one with design A and the clocking configurations 12 and 18 of designs A and B, respectively, and the other with design B retaining its clock configuration as shown by FIG. 8. The two Verilog files may be compiled through the same or similar steps as described in connection with the flowchart of FIG. 6 to produce respective full and partial bit stream files for the A design plus B clock configuration verilog file and the B design Verilog file. Note that the resulting partial bit stream file for the B design will be without its clock configuration programming information. The PGA may then be first programmed with the full bit stream file of the A design plus B clock configuration to configure the left hand and clock configuration columns of the chip accordingly with the right hand columns thereof left blank as shown by the illustration of FIG. 7. Thereafter, the PGA may be programmed with the partial bit stream of the B design without its clock configuration programming information to partially reconfigure only the right hand columns of the PGA and yield a fully configured PGA as shown by the illustration of FIG. 2. Note that when the PGA is partially reconfigured with the partial bit stream file of the B design without clock configuration programming information, the frames of the clock configuration column are not programmed, i.e. overwritten. These frames were already programmed by the clock routing and configuration programming of the full bit stream with the embedded clocking configurations of all of the designs. While this alternate embodiment copies the clock configuration of design B from the Verilog file of design B and embeds it into the Verilog file of design A, the reverse could also be accomplished without deviating from the broad principles of the present invention.

Actually, in this preferred embodiment, the clocking configurations of all of the designs of the PGA may be copied and embedded into all of the Verilog design files so that each new Verilog file of a design of the PGA will include the clocking configurations of all of the other designs of the PGA. In this example, the new Verilog files may be compiled as described herein above in connection with the steps of FIG. 6 to create both a full and partial bit stream file. In each case, the partial bit stream files of the various designs will not include any clock configuration programming information. Then, the PGA may be configured with the full bit stream file of a designated one of the designs first, and then partially reconfigured with partial bit stream files of the other designs without overwriting the clock configuration columns.

In yet another embodiment of the present invention, the programs of designs A, "prupcnt.v", and B, "prdncnt.v" as shown in Appendix I hereof may be compiled to produce respective full and partial bit stream files for programming the PGA using the same or similar steps as described in connection with the flow chart of FIG. 6. Then, the bit stream portions for programming the clock frames may be copied from the full bit stream file of each of the designs and saved in a separate clock template bit stream file. The PGA may be programmed with the saved clock template bit stream file in between the programming with the full bit stream file of design A and partial bit stream file B resulting in a sequence of programming configurations of the PGA as shown by the illustrations of FIGS. 3, 7, and 2. It is understood that the programming sequence of the A and B designs may be reversed without deviating from the broad principles of the present invention so long as the programming of the clock configuration column is not overwritten.

As explained above, the present embodiments are not limited to just two designs, but rather may be extended to programming the PGA with multiple designs each having a different clocking configuration as exemplified by the illustration of FIG. 10. In FIG. 10, the PGA involves a configuration in which each column thereof is programmed with a different design A through Z with the clock configuration or center column programmed with the different clocking structures of all of the designs. Any of the embodiments described herein above, that is, either an independent clocking template, the clock configurations of all of the designs embedded into at least one design, or copying the clock frame bit streams of each into a separate clock template bit stream file, may be used to support and satisfy this wide range of clocking requirements.

While the present invention has been described herein above in connection with a variety of embodiments, it is understood that this was done merely by way of example and that the present invention should not be limited in any way, shape or form from the descriptions of these embodiments. Rather, the present invention should be construed in breadth and broad scope from the recitation of the claims appended hereto.

APPENDIX I

```
/***********************************************************\
*                                                           *
* Module      : prupcnt.v                                   *
*                                                           *
* Description:                                              *
* Design of partial reconfig of UP counter design.          *
\***********************************************************/
'timescale 1ns / 10ps
module prupcnt (clockA_in, gsr_b, MatrixRow, MatrixCol,
SevenSeg, SevenSegCom);
input clockA_in, gsr_b
```

APPENDIX I — continued

```
output [3:0] MatrixRow, MatrixCol;
output [7:0] SevenSeg;
output SevenSegCom;
reg [19:0] countA;
reg [7:0] countB;
reg [3:0] countC;
reg [3:0] MatrixRowr;
reg [25:0] divcount;
reg direction;
reg clken_256hz_dly, clken_4hz_dly;
wire clock, clockA_buf;
wire clken_512hz, clken_256hz, clken_8hz, clken_4hz;
wire clkpulse_512hz, clkpulse_8hz;
// ClockA is designed as 33Mhz crystal, or more accurately,
// 2^25
IBUFG ibufg1 (.I(clockA_in), .O(clockA_buf));
BUFG bufg1 (.I(clockA_buf), .O(clockA));
always @ (posedge clockA)
    if (! Gsr_b) divcount <= 'h0;
    else divcount <= divcount + 1;
assign clken_512hz = divcount[16];
assign clken_256hz = divcount[17];
assign clken_8hz = divcount[22];
assign clken_4hz = divcount[23];
always @(posedge clockA)
    clken_256hz_dly <= clken_256hz;
always @(posedge clockA)
    clken_4hz_dly <= clken_4hz;
assign clkpulse_512hz = (clken_256hz != clken_256hz_dly);
assign clkpulse_8hz = (clken_4hz != clken_4hz_dly);
always @(posedge clockA)
    if (! Gsr_b) direction <= 0;
    else direction <= 1;
always @(posedge clockA)
    if (! Gsr_b) countA <= 'h0;
    else if (clkpulse_512hz)
        if (direction) countA <= countA + 1;
        else          countA <= countA - 1;
always @(posedge clockA)
    if (! Gsr_b) countB <= 'h1;
    else if (clkpulse_8hz)
        if (direction) countB <= { countB[0] , countB[7:1] };
        else          countB <= { countB[6:0], countB[7] };
always @(posedge clockA)
    if (! Gsr_b) countC <= 'h1;
    else if (clkpulse_512hz) countC <= { countC[2:0],
countC[3] };
assign Sevenseg = countB;
assign SevenSegCom = 0;
always @(posedge clockA)
    if (! Gsr_b) MatrixRowr <= 0;
    else MatrixRowr <= (countA[18:15] & {4{countC[3]}}) |
        (countA[14:11] & {4{countC[2]}}) |
        (countA[10:7] & {4{countC[1]}}) |
        (countA[6:3] & {4{countC[0]}});
assign MatrixRow = MatrixRowr;
assign MatrixCol = ~ countC[3:0];
endmodule
/***********************************************************\
*                                                           *
* Module      : prdncnt.v                                   *
*                                                           *
* Description:                                              *
* Design of partial reconfig of DN counter design.          *
\***********************************************************/
'timescale 1ns / 10ps
module prdncnt (clockB_in, gsr_b, MatrixRow, MatrixCol,
SevenSeg, SevenSegCom);
input clockB_in, gsr_b;
output [3:0] MatrixRow, MatrixCol;
output [7:0] SevenSeg;
output SevenSegCom;
reg [19:0] countA;
reg [7:0] countB;
reg [3:0] countC;
reg [3:0] MatrixRowr;
reg [25:0] divcount;
```

APPENDIX I

```
reg direction;
reg clken_256hz_dly, clken_4hz_dly;
wire clock, clockB_buf,
wire clken_512hz, clken_256hz, clken_8hz, clken_4hz
wire clkpulse_512hz, clkpulse_8hz;
// ClockB is designed as 33Mhz crystal, or more accurately,
// 2^25
IBUFG ibufgl (.I(clockB_in), .O(clockB_buf));
BUFG bufg1 (.I(clockB_buf), .O(clockB));
always @(posedge clockB)
   if (! Gsr_b) divcount <= 'h0;
   else divcount <= divcount + 1;
assign clken_512hz = divcount[16];
assign clken_256hz = divcount[17];
assign clken_8hz = divcount[22];
assign clken_4hz = divcount[23];
always @(posedge clockB)
   clken_256hz_dly <= clken_256hz;
always @(posedge clockB)
   clken_4hz_dly <= clken_4hz;
assign clkpulse_512hz = (clken_256hz != clken_256hz_dly);
assign clkpulse_8hz = (clken_4hz   != clken_4hz_dly);
always @(posedge clockB)
   if (! Gsr_b) direction <= 1;
   else direction <= 0;
always @(posedge clockB)
   if (! Gsr_b) countA <= 'h0;
   else if (clkpulse_512hz)
      if (direction) countA <= countA + 1;
      else           countA <= countA - 1;
always @(posedge clockB)
   if (! Gsr_b) countB <= 'h1;
   else if (Clkpulse_8hz)
      if (direction) countB <= { countB[0] , countB[7:1] };
      else           countB <= { countB[6:0], countB[7] };
always @(posedge clockB)
   if (! Gsr_b) countC <= 'h1;
   else if (clkpulse_512hz) countC <= { countC[2:0],
countC[3] };
assign SevenSeg = countB;
assign SevenSegCom = 0;
always @(posedge clockB)
   if (! Gsr_b) MatrixRowr <= 0;
   else MatrixRowr <= (countA[18:15] & {4{countc[3]}}) |
        (countA[14:11] & {4{countc[2]}}) |
        (countA[10:7] & {4{countC[1]}}) |
        (countA[6:3] & {4{countC[0]}});
assign MatrixRow = MatrixRowr;
assign MatrixCol = ~ countC[3:0];
endmodule
```

APPENDIX II

```
/*************************************************\
* Module : ict.v                                   *
*                                                  *
* Description:                                     *
* Design containing Independent Clock Template logic *
* for both design A (prupcnt) and B (prdncnt).     *
*                                                  *
* Synplicity directive "syn_noprune" is set to disallow *
* optimization of unused clock buffers. After the  *
* design is processed, only the relevant clock column *
* bitstream programming will be saved, and the dummy *
* logic programming will be discarded.             *
\*************************************************/
'timescale 1ns / 10ps
module ict (clockA_in, clockB_in);
input clockA_in, clockB_in;
wire clockA_buf, clockB_buf;
wire clockA /* synthesis syn_keep=1 */;
wire clockB /* synthesis syn_keep=1 */;
wire dummyflopA /* synthesis syn_keep=1 */;
wire dummyflopB /* synthesis syn_keep=1 */;
```

APPENDIX II-continued

```
IBUFG ibufgA (.I(clockA_in), .O(clockA_buf));
BUFG bufgA (.I(clockA_buf), .O(clockA)) /* synthesis
syn_noprune=1 */;
IBUFG ibufgB (.I (clockB_in), .O(clockB_buf));
BUFG bufgB (.I(clockB_buf), .O(clockB)) /* synthesis
syn_noprune=1 */;
FD FD_A (.C(clockA), .D(1'b1), .Q(dummyflopA)) /* synthesis
syn_noprune=1 */;
FD FD_B (.C(clockB), .D(1'b1), .Q(dummyflopB)) /* synthesis
syn_noprune=1 */;
endmodule
```

What is claimed is:

1. A clock template comprising digital programming information representative of a plurality of different clock configurations, wherein the plurality of different clock configurations correspond to a plurality of designs for programming clock frames of a programmable gate array (PGA), and wherein the digital programming information comprises information used to configure the PGA in accordance with said corresponding plurality of designs.

2. The clock template of claim 1 wherein the digital information comprises a bit stream for partially reconfiguring the PGA.

3. The clock template of claim 2 wherein the bit stream is produced from a compilation of a high level descriptive design language program of clock configuration extracts from a plurality of high level descriptive design language programs of the designs.

4. The clock template of claim 1 comprising extracts of clock configurations copied from the plurality of designs, said extracts being embedded in digital programming information of at least one of the plurality of designs.

5. The clock template of claim 4 comprising a bit stream produced from a compilation of a high level descriptive design language program of the at least one design embedding the clock configuration extracts.

6. The clock template of claim 1 wherein the digital information comprises a bit stream for partially reconfiguring the PGA, said bit stream comprising bit streams of clock configurations copied from bit streams compiled from the plurality of designs.

7. The clocking template of claim 1 comprising dummy logic in high level descriptive design language for the different clock configurations.

8. The clocking template of claim 1 comprising special constraints in high level descriptive design language for the different clock configurations.

9. Method A method of configuring a PGA with a plurality of different designs having different clocking configurations, said method comprising the steps of:

creating a high level descriptive design language representation of each of the plurality of designs, each said design representation including a clocking configuration portion;

copying said clocking configuration portions from said design representations into a high level descriptive design language clock template; and using said clock template to configure the PGA.

10. The method of claim 9 including the steps of: compiling the clock template as an independent high level descriptive design language file to produce a bit stream representation thereof; and programming clocking frames of the PGA with said clock template bit stream representation.

11. The method of claim 10 wherein the step of programming includes partially reconfiguring the clocking frames of the PGA with said clock template bit stream representation.

12. The method of claim 9 including the steps of:

embedding the clock template into at least one of the high level descriptive language designs of the plurality to form at least one composite high level descriptive design language file;

compiling each said composite file as an independent high level descriptive design language file to produce a bit stream representation thereof; and programming clocking frames of the PGA with one of said composite file bit stream representations.

13. The method of claim 12 wherein the step of programming includes configuring the PGA with said one composite file bit stream representation.

14. The method of claim 12 including the steps of:

compiling high level descriptive language files of designs of the PGA to produce partial bit stream design representations thereof, wherein said partial bit stream design representations do not include clock configurations; and partially reconfiguring the PGA with said partial bit stream design representations.

15. The method of claim 12, wherein:

the step of compiling includes compiling each composite file as an independent high level descriptive design language file to produce at least one full bit stream representation and partial bit stream representations, wherein said partial bit stream representations do not include clock configurations; and the step of programming includes configuring the PGA with the full bit stream representation of a designated composite file first, and then, partially reconfiguring the PGA with partial bit stream representations of designs other than the design of the designated composite file.

16. The method of claim 9 including the step of adding to the clock template dummy logic high level descriptive design language representations for the clocking configurations of the clock template.

17. The method of claim 9 including the step of adding to the clock template special constraints high level descriptive design language representations for the clocking configurations of the clock template.

18. A method of configuring a PGA with a plurality of different designs having different clocking configurations, said method comprising the steps of:

creating a high level descriptive design language representation of each of the plurality of designs, each said design representation including a clocking configuration portion;

compiling the design representations as independent high level descriptive design language files to produce bit stream representations thereof;

extracting from said bit stream design representations bit stream portions representative of the clocking configurations of each design; and programming clocking frames of the PGA with said extracted bit stream portions.

19. The method of claim 18 wherein the step of programming including the steps of combining the extracted bit stream portions to form a clock template; and configuring the clocking frames of the PGA with said clock template.

20. The method of claim 19 wherein the step of configuring includes partially reconfiguring the clocking frames of the PGA with the clock template.

21. The method of claim 18 wherein the step of programming includes partially reconfiguring the clocking frames of the PGA with the extracted bit stream portions.

* * * * *